United States Patent [19]
Lin

[11] Patent Number: 6,124,162
[45] Date of Patent: Sep. 26, 2000

[54] METHOD FOR MANUFACTURING CYLINDRICAL LOWER ELECTRODE OF DRAM CAPACITOR

[75] Inventor: Benjamin Szu-Min Lin, Chiayi, Taiwan

[73] Assignee: United Microelectronics Corp., Hsinchu, Taiwan

[21] Appl. No.: 09/207,171

[22] Filed: Dec. 7, 1998

[51] Int. Cl.[7] .............................................. H01L 21/8234
[52] U.S. Cl. ........................... 438/238; 438/253; 438/396
[58] Field of Search .................................. 438/238, 253, 438/396

[56] References Cited

U.S. PATENT DOCUMENTS

| | | | |
|---|---|---|---|
| 5,736,450 | 4/1998 | Huang et al. | 438/396 |
| 5,843,821 | 12/1998 | Tseng | 438/253 |
| 5,989,954 | 11/1999 | Lee et al. | 438/253 |

*Primary Examiner*—Richard Elms
*Assistant Examiner*—Pho Luu
*Attorney, Agent, or Firm*—Hickman Coleman & Hughes, LLP

[57] ABSTRACT

A method for forming the cylindrical lower electrode of a capacitor includes the steps of providing a semiconductor substrate, and then forming an insulation layer over the substrate. Next, a contact opening is formed in the insulation layer, and then a conductive layer is formed, filling the contact opening and covering the insulation layer. Subsequently, a patterned photoresist layer is formed over the conductive layer. Thereafter, silylated photoresist spacers are formed on the sidewalls of the photoresist layer. Finally, using the spacers as a mask, the photoresist layer and a portion of the conductive layer are etched away to form the cylindrical-shaped lower electrode of a capacitor.

9 Claims, 5 Drawing Sheets

METHOD FOR MANUFACTURING CYLINDRICAL LOWER ELECTRODE OF DRAM CAPACITOR

CLAIM OF FOREIGN PRIORITY PURSUANT TO 35 U.S.C. §119

This application claims foreign priority under 35 U.S.C. §119 from Taiwanese Patent Application Serial Number 87117026 filed Oct. 14, 1998, which is incorporated herein by reference for all purposes.

BACKGROUND OF THE INVENTION

1. Field of Invention

The present invention relates to a method for manufacturing semiconductor devices. More particularly, the present invention relates to a method for manufacturing the cylindrical lower electrode of a DRAM capacitor.

2. Description of Related Art

Dynamic random access memory (DRAM) having a storage capacity smaller than one million megabits (Mbits) generally has a two-dimensional or so-called planar type of capacitor structure. However the planar type of capacitor occupies a large surface area of the semiconductor substrate, and hence is unsuitable for forming, high-level integrated circuits. For DRAM having storage capacity greater than four Mbits, three-dimensional capacitor structures such as the stack type or the cylindrical type of capacitor are generally used.

FIGS. 1A through 1F are schematic, cross-sectional views showing the progression of manufacturing steps according to a conventional method of forming the cylindrical lower electrode of a DRAM capacitor. First, as shown in FIG. 1A, a semiconductor substrate 10 that has source/drain regions (not shown) thereon is provided. Thereafter, an insulation layer 12 for example, a silicon oxide layer is deposited over the substrate 10, and then a contact opening 14 is formed in the insulation layer 12. Next, a conductive layer 16, for example, a polysilicon layer, is formed, filling the contact opening 14 and covering the insulation layer 12. The conductive layer 16 inside the contact opening forms a contact that serves as an electrical connection between the source/drain region and the subsequently formed capacitor.

Next, as shown in FIG. 1B, photolithographic operations are carried out by first forming a photoresist layer 18 over the conductive layer 16 and then patterning the photoresist layer 18.

Next, as shown in FIG. 1C, using the photoresist layer 18 as a mask a portion of the conductive layer 19 is etched. By controlling the etching period a pre-defined layer of the conductive layer 16 is removed to form a protruding block 20. Finally, the photoresist layer 18 is removed.

Next, insulating material is deposited over the conductive layer 16 and the protruding block 20 as shown in FIG. 1D. Thereafter, the insulation layer is etched back in an anisotropic etching operation to form spacers 22 on the sidewalls of the protruding block 22.

Next, as shown in FIG. 1E, using the spacers 22 as a mask, the conductive layer 16 is again etched to form a cylindrical-shaped lower electrode structure 16a. In the process, sharp spikes 24 are also formed on the inner sidewalls of the spacers 22. The layer of conductive material to be removed from the conductive layer 16 is again controlled by the etching period.

Finally, as shown FIG. 1F, the spacers 22 are removed to form the cylindrical lower electrode 16a of a capacitor above the insulation layer 12 using a wet etching method.

In the aforementioned method or forming the cylindrical lower electrode 1 6a of the capacitor the spacers 22 that act as a mask layer must be formed by first forming an insulation layer over the substrate 10. Next, the insulation layer is etched back anisotropically to form the spacers in the sidewalls of the protruding block structure 20. The processing steps are complicated and hence often lead to various kinds of errors that may affect the product yield. Furthermore sharp spikes 24 are frequently formed on top of the cylindrical lower electrode 1 6a. These sharp spikes 24 can easily become a particle source. Hence, when a dielectric layer is subsequently formed over the electrode 16a, the step of immersing the substrate in an acid bath will lead to contamination and the production of leakage current in an operating capacitor.

In light of the foregoing there is a need to improve the method of forming the cylindrical lower electrode of a capacitor.

SUMMARY OF THE INVENTION

Accordingly, the present invention provides a method for forming the cylindrical lower electrode of a capacitor that can reduce processing errors due to complicated procedures necessary in a conventional method. Furthermore the method is capable of removing unwanted sharp spikes from the capacitor, thereby minimizing current leakage.

To achieve these and other advantages and in accordance with the purpose of the invention, as embodied and broadly described herein the invention provides a method for forming the cylindrical lower electrode of a capacitor. The method includes the steps of providing a semiconductor substrates and then forming an insulation layer over the substrate. Next, a contact opening is formed in the insulation layer, and then a conductive layer is formed filling the contact opening and covering the insulation layer. Subsequently, a patterned photoresist layer is formed over the conductive layer. Thereafter, silylated photoresist is deposited over the conductive layer and the photoresist layer, and then the silylated photoresist layer is etched to form spacers. Finally, using the spacers as a mask, the photoresist layer and a portion of the conductive layer are etched away to form the cylindrical-shaped lower electrode of a capacitor above the insulation layer.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and together with the description serve to explain the principles of the invention. In the drawings.

DESCRIPTION OF THE PREFERRED EMBODIMENTS

Figure 1A:
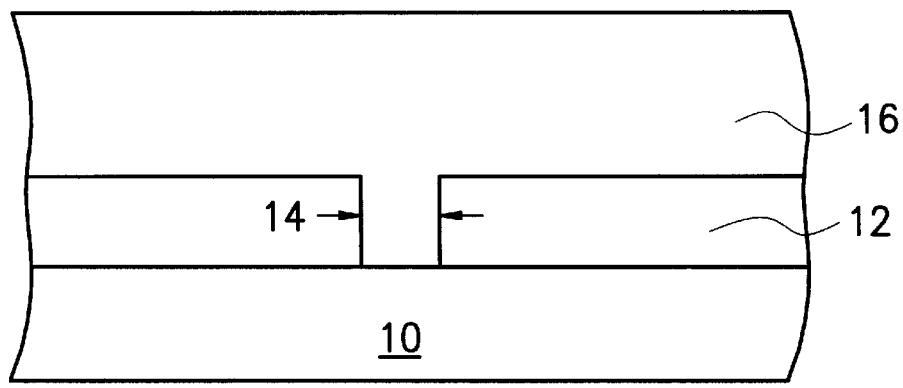
FIGS. 1A through 1F are schematic cross-sectional views showing the progression of manufacturing steps according to a conventional method of forming the cylindrical lower electrode o a DRAM capacitor.
Figure 1B:
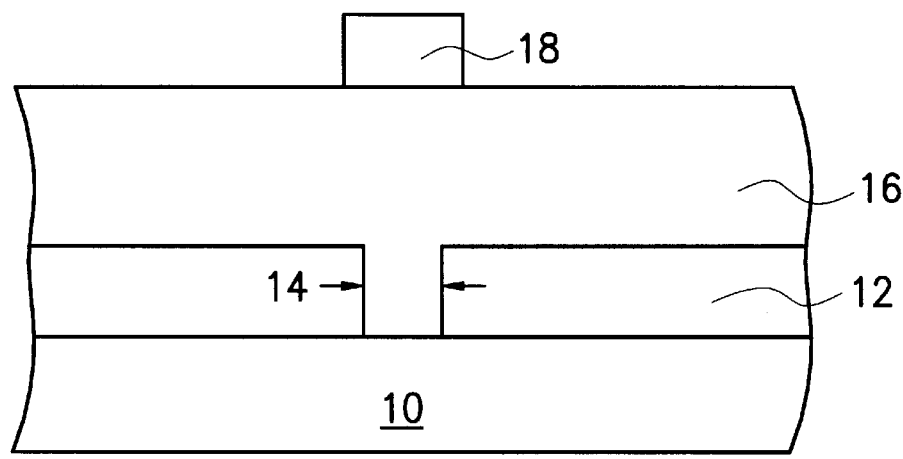
Figure 1C:
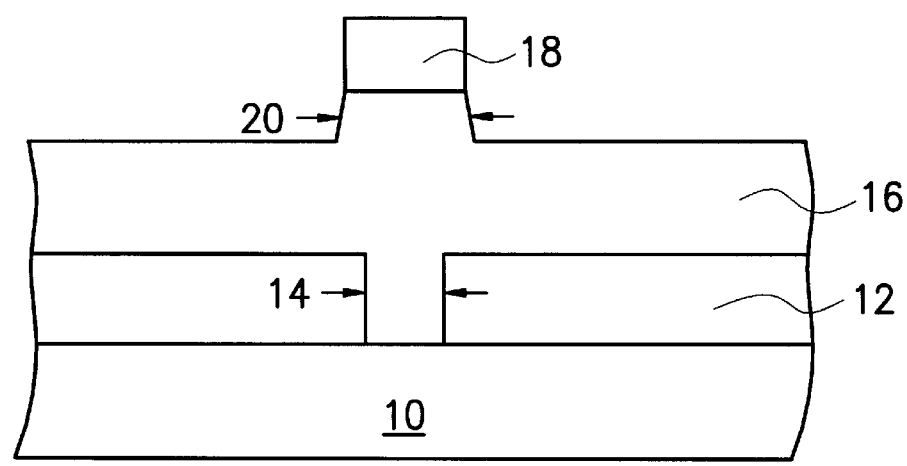
Figure 1D:
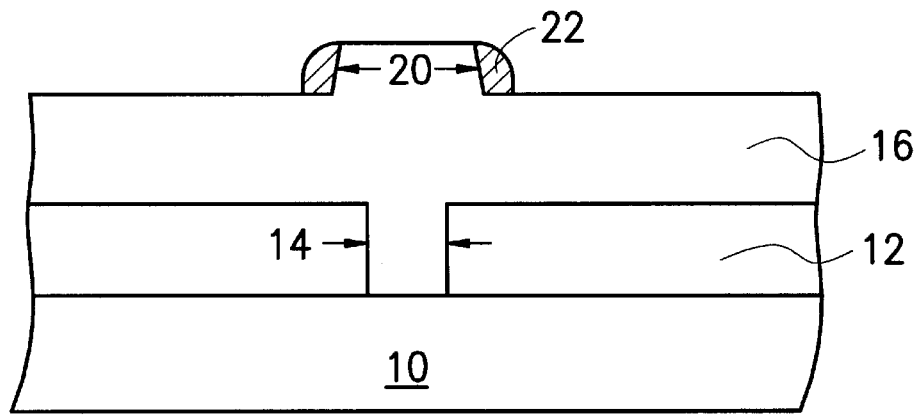
Figure 1E:
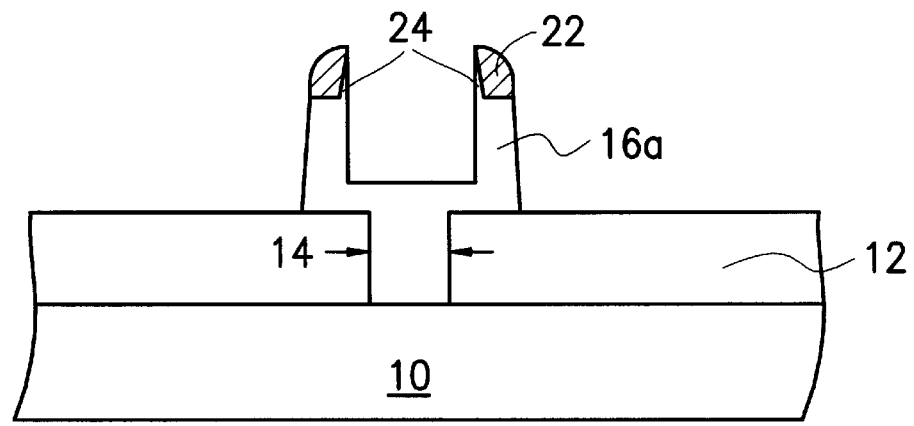
Figure 1F:
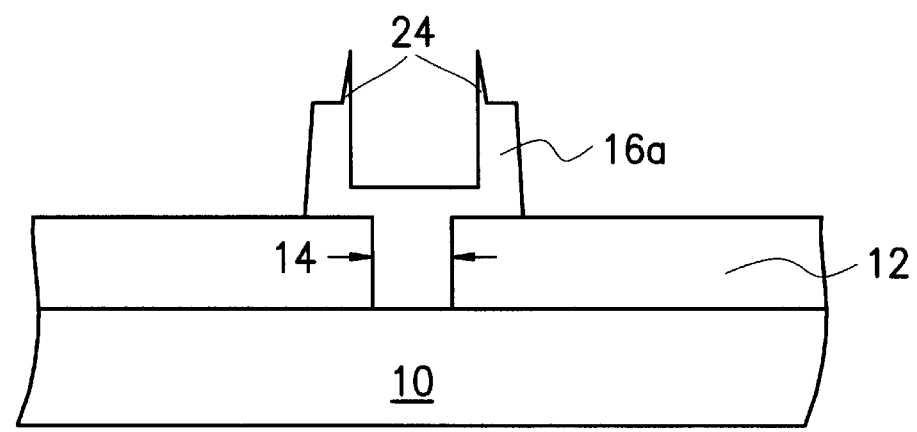

Reference will now be made in detail to the present preferred embodiments of the invention, examples of which are illustrated in the accompanying drawings. Wherever possible the same reference numbers are used in the drawings and the description to refer to the same or like parts.

The characteristic of this invention lies in the use of a silylated photoresist film to serve as a mask layer. Using the silylated photoresist mask, a second photoresist layer and a portion of the conductive layer above an insulation layer can be anisotropically etched to form a cylindrical-shaped lower electrode above the insulation layer.

FIGS. 2A through 2G are cross-sectional views showing the progression of manufacturing steps for forming the cylindrical lower electrode of a DRAM capacitor according to one preferred embodiment of this invention.

Figure 2A:
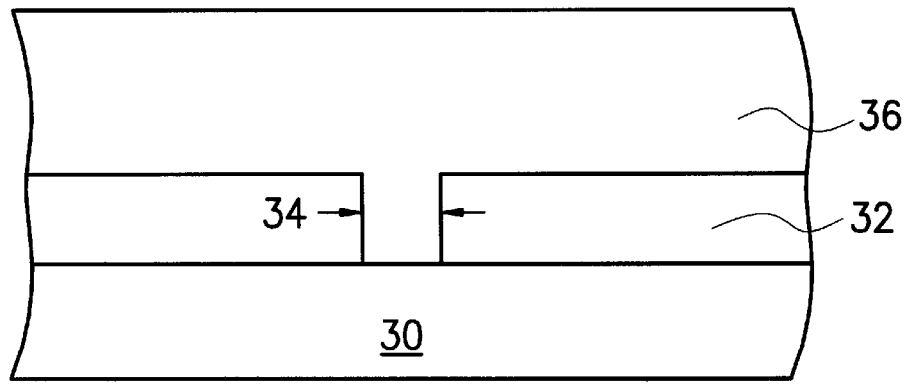
FIGS. 2A through 2G are schematic cross-sectional views showing the progression of manufacturing steps for forming the cylindrical lower electrode of a DRAM capacitor according to one preferred embodiment of this invention.

As shown in FIG. 2A, a semiconductor substrate 30 that has source/drain regions (not shown) thereon is provided. Thereafter, an insulation layer 32, or example, a silicon oxide layer is deposited over the substrate 30 using a chemical vapor deposition (CVD) method. Then, a contact opening 34 is formed in the insulation layer 32. A conductive layer 36, for example, a polysilicon layer is formed filling the contact opening 34 and covering the insulation layer 32. The conductive layer 36 inside the contact opening forms a contact that serves as an electrical connection between the source/drain region and the subsequently formed capacitor.

Figure 2B:
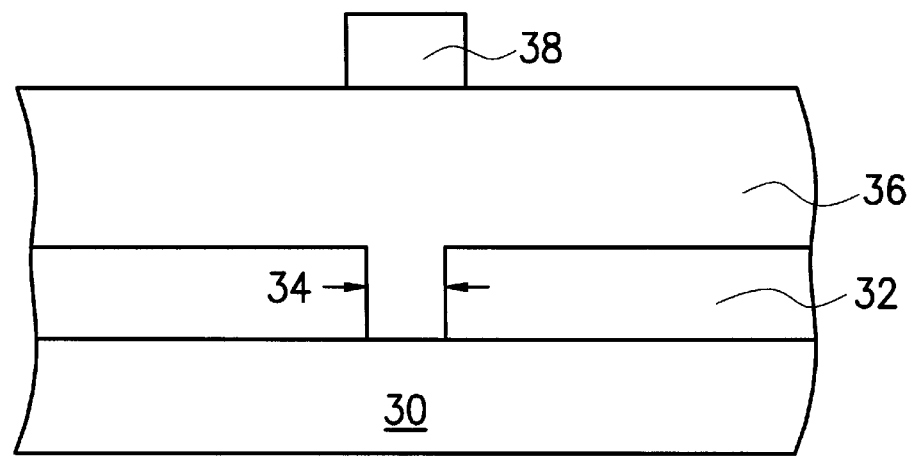

As shown in FIG. 2B, photolithographic operations are carried out to form a patterned photoresist layer 38. The method include the steps of first forming a photoresist layer over the conductive layer 16, and then exposing the photoresist layer to light through a pattern photomask. The photoresist pattern within the photoresist layer is developed to form the photoresist layer 38.

Figure 2C:
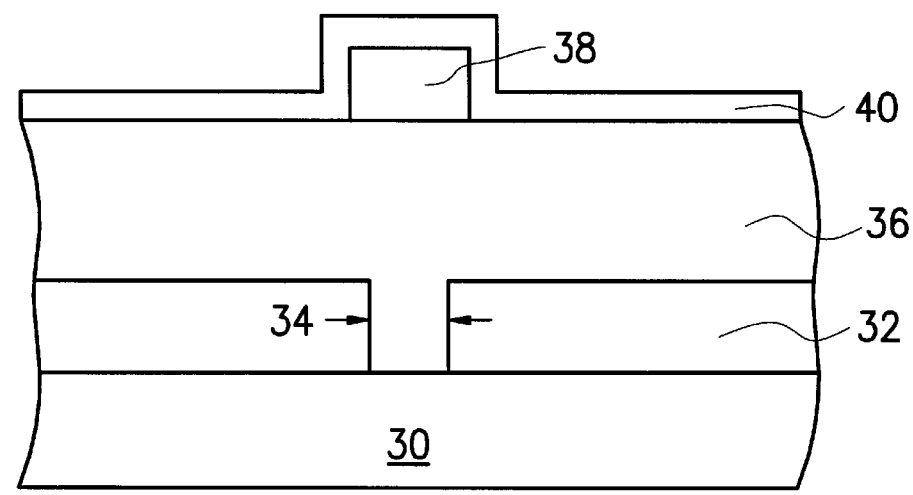
Figure 2D:
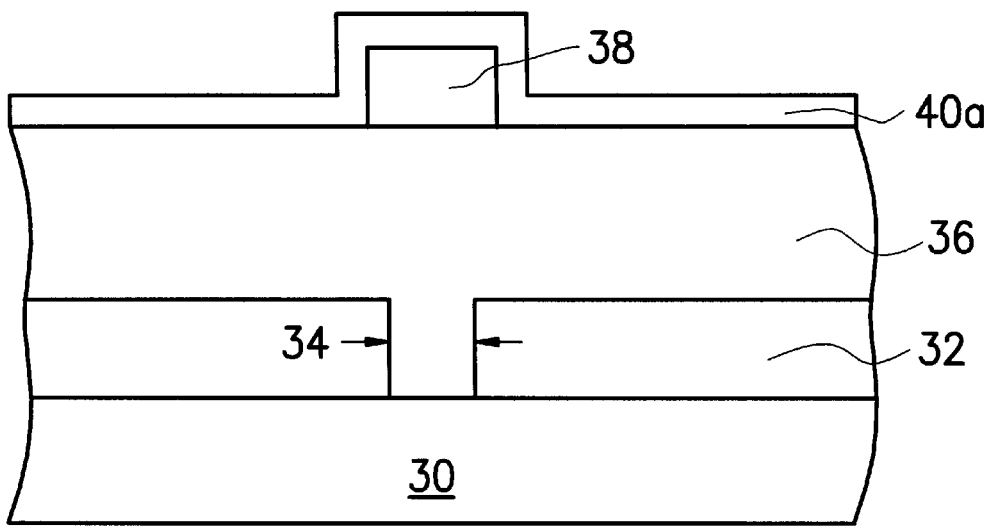

As shown in FIGS. 2C and 2D, a conformal silylated photoresist layer 40a is formed over the conductive layer 36 and the photoresist layer 38. The conformal silylated photoresist layer is formed by first coating a conformal photoresist layer capable of being silylated or a conformal deep-ultraviolet photoresist layer 40 over the conductive layer 36 and the photoresist layer 38. Then, the layer 40 is exposed to deep-ultraviolet light. The light-exposed photoresist layer 38 is silylated to form a silylated photoresist layer 40a using silane as the reactive agent. The silylated photoresist layer 40a is later transformed into spacers.

One major aspect in this invention is the formation of a silylated photoresist layer 40 directly over the semiconductor substrate 30. There is no need to remove the photoresist layer 38 first. Hence, unlike the processing steps used in a conventional method, switching of processing station to remove the photoresist layer prior to forming the spacers is not required. Therefore, the number of processing steps is reduced.

Figure 2E:
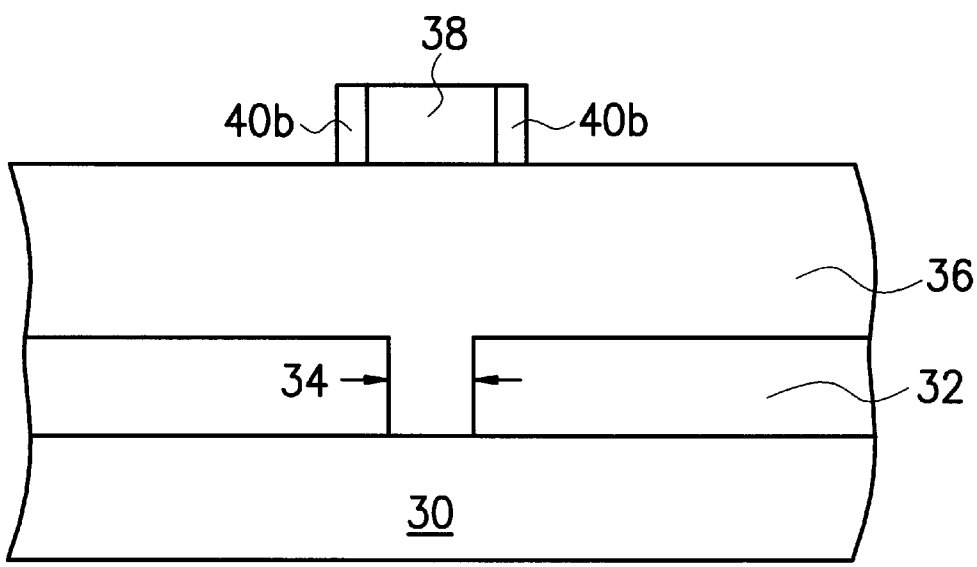

As shown in FIG. 2E, a portion of the silylated photoresist layer 40a is removed using, for example, an anisotropic etching operation. Therefore, spacers 40b are formed on the sidewalls of the photoresist layer 38.

Figure 2F:
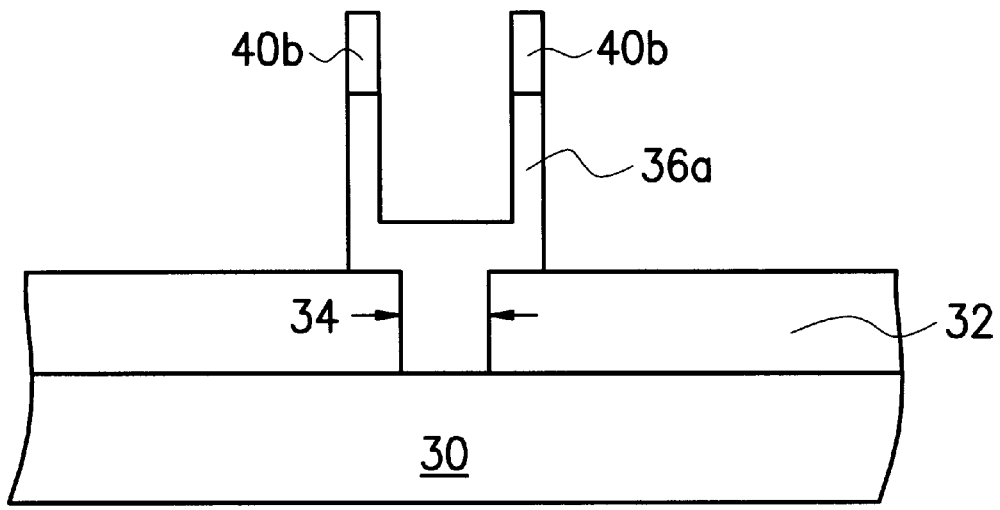

As shown FIGS. 2E and 2F, using the spacers 40b as a mask, the photoresist layer 38 aid the conductive layer 36 are etched using for example, an anisotropic dry etching method. The etching continues until the insulation layer 32 is exposed.

Since both the photoresist layer 38 and the conductive layer 36 are etched simultaneously using the spacers 40b as a mask, an etchant having a high etching selectivity between the spacers 40b on one hand and the photoresist layer 38 and the conductive layer 36 on the other must be chosen. Consequently, the exposed photoresist layer 38 and the exposed conductive layer 36 can be etched away quite readily, whereas the spacers 40b and the conductive layer 36 underneath the spacers 40b are difficult to remove. Because a portion of the conductive layer 36 is covered by the photoresist layer 38, the photoresist layer 38 can serve as an etching buffer layer during the etching operation. Hence, the amount of conductive material in the conductive layer 36 underneath the photoresist layer 38 removed during the etching operation will be smaller. Etching stops when the insulation layer 32 not covered by the photoresist layer 38, and the spacers 40b is exposed. Due to the buffering action of the photoresist layer 38, a portion of the conductive layer 36 lying underneath the photoresist layer 38 is retained. Consequently, a cylindrical lower electrode structure 36a having spacers 40b on top is finally formed above the insulation layer 32 as shown in FIG. 2F.

Figure 2G:
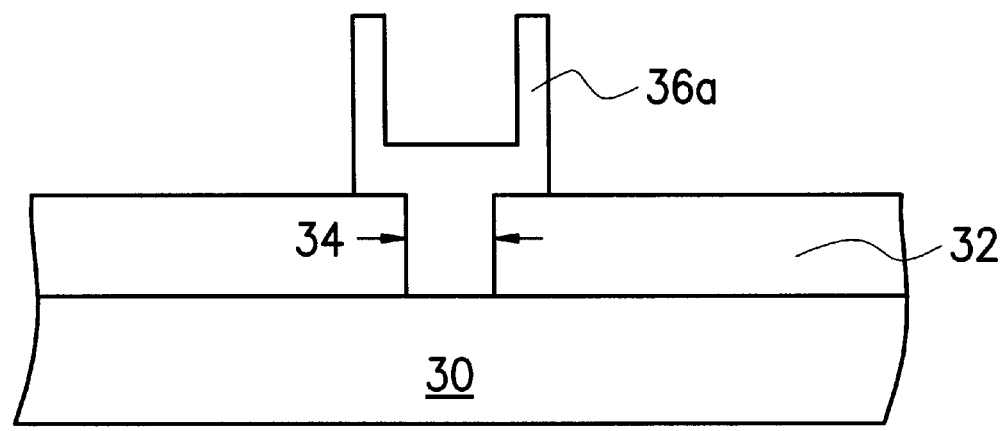

In the subsequent step, a wet etching operation is performed to remove the spacers 40b, thereby forming the cylindrical lower electrode 36a of a DRAM capacitor as shown in FIG. 2G.

In summary, the advantages of forming the cylindrical lowrer electrode of a DRAM capacitor according to the embodiment of this invention include:

1. The conventional method of forming the etching mask of the lower electrode requires a patterning operation to forming a protruding block of the conductive layer using a photoresist layer. Afterwards, the photoresist has to be removed followed by the deposition of an insulation layer over the substrate. Finally, an anisotropic etching operation must he performed to form masking spacers. In this invention, there is no need to remove the photoresist layer or to pattern the conductive layer. Instead, silylated photoresist masks for forming the lower electrode are formed directly. Hence, the cylindrical lower electrode of a capacitor is formed in a single etching operation. Therefore, many steps are eliminated compared with the conventional methods. Consequently errors are reduced and product yield is increased.

2. Unwanted sharp spikes that frequently form using the conventional method are eliminated. Hence, the problem of having a leakage current in an operating capacitor is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming the cylindrical lower electrode of a capacitor, comprising the steps of:

providing a semiconductor substrate;

forming an insulation layer over the substrate;

forming a contact opening in the insulation layer;

forming a conductive layer that fills the contact opening and covers the insulation layer;

forming a patterned photoresist layer over the conductive layer;

forming spacers on the sidewalls of the photoresist layer;

etching away the photoresist layer and a portion of the conductive layer using the spacers as a mask, thereby forming the cylindrical-shaped lower electrode of a capacitor above the insulation layer; and removing the residual spacers.

2. The method of claim 1, wherein the step of forming the spacers includes the substeps of:

forming a conformal silylated photoresist layer that covers the photoresist layer and the conductive layer; and performing an anisotropic dry etching operation to remove a portion of the silylated photoresist layer, thereby forming spacers on the sidewalls of the photoresist layer.

3. The method of claim 1, wherein the step of forming the spacers includes the substeps of:

coating a deep-ultraviolet photoresist layer over the photoresist layer and the conductive layer;

performing a silylation reaction silylating the deep ultraviolet photoresist layer into a silylated photoresist layer; and performing an anisotropic dry etching operation to remove a portion of the silylated photoresist layer, thereby forming spacers on the sidewalls of the photoresist layer.

4. The method of claim 1, wherein the step of etching away the photoresist layer and a portion of the conductive layer includes performing an anisotropic dry etching operation.

5. The method of claim 1, wherein the step of removing the spacers includes performing a wet etching operation.

6. A method for forming the cylindrical lower electrode of a capacitor, comprising the steps of:

providing a semiconductor substrate;

forming an insulation layer over the substrate;

forming a contact opening in the insulation layer;

forming a conductive layer that fills the contact opening and covers the insulation layer;

forming a patterned photoresist layer over the conductive layer;

forming a conformal silylated photoresist layer above the substrate;

removing a portion of the silylated photoresist layer to form silylated photoresist spacers on the sidewalls of the photoresist layer;

etching away the photoresist layer and a portion of the conductive layer using the silylated photoresist spacers as a mask thereby forming the cylindrical-shaped lower electrode of a capacitor above the insulation layer; and removing the residual silylated photoresist spacers.

7. The method of claim 6, wherein the step of forming the silylated photoresist layer includes the substeps of:

coating a deep-ultraviolet photoresist layer over the photoresist layer and the conductive layer; and performing a silylation reaction silylating the deep-ultraviolet photoresist layer into a silylated photoresist layer.

8. The method of claim 6, wherein the step of etching away the photoresist layer and a portion of the conductive layer includes performing an anisotropic dry etching operation.

9. The method of claim 6, wherein the step of removing the silylated photoresist spacers includes performing a wet etching operation.

* * * * *